United States Patent [19]

Ojha et al.

[11] Patent Number: 5,419,804

[45] Date of Patent: May 30, 1995

[54] SEMICONDUCTOR ETCHING PROCESS

[75] Inventors: Sureshchandra M. Ojha, Harlow; Stephen J. Clements, Stansted, both of United Kingdom

[73] Assignee: Northern Telecom Limited, Montreal, Canada

[21] Appl. No.: 197,071

[22] Filed: Feb. 16, 1994

[30] Foreign Application Priority Data

Feb. 18, 1993 [GB] United Kingdom ............ 9303257

[51] Int. Cl.$^6$ .................. H01L 21/306; B44C 1/22
[52] U.S. Cl. .................. 156/643.1; 252/79.1; 437/129; 437/234
[58] Field of Search ............ 156/643, 646, 649, 652, 156/655, 662; 252/79.1; 437/126, 129, 234

[56] References Cited

U.S. PATENT DOCUMENTS 5,068,007 11/1991 Rogers et al. .................. 156/643

*Primary Examiner*—William Powell
*Attorney, Agent, or Firm*—Lee, Mann, Smith, McWilliams, Sweeney & Ohlson

[57] ABSTRACT

A process for plasma etching a compound semiconductor heterostructure, e.g. to fabricate a ridge laser on a wavelength demultiplexer comprises anisotropic etching of the semiconductor by exposure to a plasma incorporating methane, hydrogen and oxygen. The oxygen content of the plasma is derived from a gaseous precursor such as carbon dioxide or nitrous oxide.

9 Claims, 4 Drawing Sheets

LASER INTERFERENCE TRACE

SEMICONDUCTOR ETCHING PROCESS

This invention relates to a process for dry etching of compound semiconductors and to semiconductor devices fabricated via the process.

BACKGROUND OF THE INVENTION

Reactive ion or plasma etching processes have been widely used for etching compound semiconductors, particularly III-V compounds, in the fabrication of optoelectronic devices such as lasers. A particular requirement of any fabrication process in this field is that of providing high quality flat optical surfaces e.g. mirror facets. Generally a methane/hydrogen mixture is employed as the etchant gas, but it has been found that this composition has a number of major disadvantages. Firstly, when etching a multilayer or heterostructure it is extremely difficult to provide smooth correctly oriented etched surfaces which can act as low loss mirrors. Secondly, polymer deposition can take place on the masking material and on the etched surface leading to surface roughening. Thirdly, the orientation of the etched surface is critically dependent on the balance between polymer deposition and etching of the semiconductor. Small variations in the etch conditions can thus have a significant effect on the quality of the etched surface. In consequence the process is difficult to control and results in relatively low yields of acceptable devices.

In an attempt to address these disadvantages some workers have investigated the addition of free oxygen to the etchant gas mixture. A process of this nature is described by J W McNabb et all in J. Vac. Sci. Technol., B9(6), Nov/Dec 1991, p.3535. This has been found to reduce the problem of polymer deposition, but has shown little improvement in the reduction of surface roughness and the control of surface orientation. It will be appreciated that any roughening of a reflective surface causes significant loss of optical signals reflected from that surface.

The object of the present invention is to minimise or to overcome these disadvantages.

SUMMARY OF THE INVENTION

According to the invention there is provided a process for selective anisotropic dry etching of a compound semiconductor heterostructure, the process including selectively masking the heterostructure and exposing the masked heterostructure under reduced pressure to a radio-frequency plasma comprising a mixture of methane and hydrogen together with carbon dioxide, nitrous oxide or mixtures thereof.

Typically the heterostructure comprises a multilayer structure of indium phosphide, indium gallium arsenide and/or indium gallium arsenide phosphide such as may be employed in laser or photo detector manufacture.

According to another aspect of the invention there is provided a process for forming a semiconductor ridge laser, the process including providing a compound semiconductor substrate having an indium gallium arsenide phosphide Q-layer, an indium phosphide layer disposed on said Q-layer and an indium gallium arsenide surface layer, applying a mask to a region of said surface layer corresponding to the position of the laser ridge and exposing the masked structure under reduced pressure to a radio frequency plasma whereby to remove the unmasked regions of said surface layer and define said ridge, wherein the plasma incorporates a hydrocarbon, hydrogen and oxygen, the oxygen content of the plasma being derived from a gaseous precursor.

BRIEF DESCRIPTION OF THE DRAWINGS

An embodiment of the invention will now be described with reference to the accompanying drawings in which.

DESCRIPTION OF PREFERRED EMBODIMENT

Figure 1:
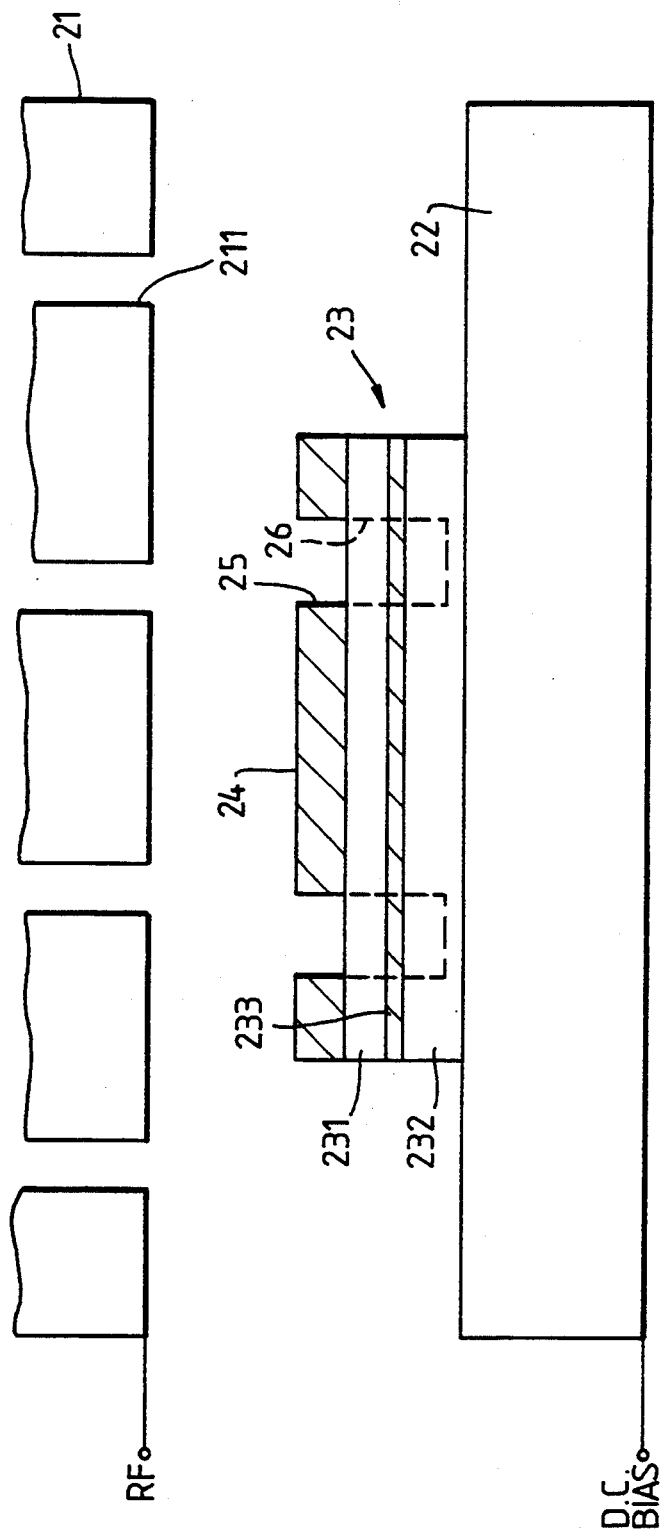
FIG. 1 is a sectional view of an electrode assembly for effecting plasma etching of a substrate.

Referring to FIG. 1, the plasma etching apparatus incorporates upper (21) and lower (22) parallel plate electrodes, the lower electrode providing a support for a semiconductor substrate body 23 to be anisotropically etched. Typically the substrate body 23 comprises a double heterostructure of first and second indium phosphide layers 231 and 232 respectively, and an indium gallium arsenide phosphide (InGaAsP) slab layer 233 intermediate the indium phosphide layers. Advantageously, the slab layer is about 0.65 microns in thickness and has a band edge of about 1.18 eV thus allowing transparent operation at a wavelength of 1.5 microns. The substrate body 23 is provided with a photolithographic mask 24 having openings 25 defining those regions of the body 23 to be anisotropically etched. The body 23 is etched by exposure under reduced pressure to a plasma containing a hydrocarbon and oxygen, the oxygen content of the plasma being provided by dissociation of a gaseous precursor. Preferably the gaseous precursor comprises carbon dioxide, nitrous oxide or mixtures thereof. Typically, the hydrocarbon is methane. In some applications the oxygen and hydrocarbon may be supplied from a single gaseous precursor such as acetone. The gas or gas mixture may be dispersed in a hydrogen gas carrier and may be supplied to the substrate surface via passageways 211 in the upper electrode 21.

A plasma is generated in the space between the electrode by the application of radio frequency energy thereto. Preferably, the radio frequency energy is applied to the upper electrode 21 and the lower electrode 22 is provided with a negative DC bias of about 400 to 500 volts. The radio frequency supply to the upper electrode is sufficient to provide an energy density of about 1 watt per cc in the space between the electrodes. The total applied radio frequency power may be about 200 watts. Etching of the substrate body 23 proceeds anisotropically in the unmasked regions to provide an etch cut 26 substantially perpendicular to the substrate surface. This etch cut can provide a mirror surface of sufficient quality to form a reflective facet e.g. for a laser.

We have employed radio frequencies of about 13 MHz and gas pressure between 1 mtorr and 200 mtorr. Preferably the pressure is maintained in the range 50 to 100 mtorr. In a typical process the gas pressure may be 50 to 60 mtorr and the gas mixture may comprise by volume 190 to 195 sccm hydrogen, 30 to 35 sccm methane and 5 to 8 sccm carbon dioxide.

In particular we have successfully employed a gas mixture comprising 193 sccm (standard cubic centimetres per minute) hydrogen, 32 sccm methane and 7.5 sccm carbon dioxide at a pressure of 60 mtorr and a radio frequency power of 200 watts. When used for etching sandwich or multilayer structures of indium phosphide and indium gallium arsenide phosphide and employing a d.c. bias of $-430$ volts, this gas mixture provided substantially polymer free smooth etched surfaces of a high reflective quality.

Etching has been found to take place at rate of 50 to 120 nm min 1 for pressures in the range 25 mtorr to 100 mtorr, and total etch depths of about 2500 nm have been achieved. Wall angles close to 90° were obtained.

A wide range of radio frequencies may be employed for generating the plasma. Typically the frequency may be from low radio frequencies of about 100 kHz to microwave frequencies of the order of 2.4 Ghz. Where a microwave frequency is employed we prefer to bias the substrate from a further radio frequency supply whose frequency may be in the range 100 kHz to 15 MHz.

In an alternative arrangement the plasma may be generated by inductive coupling. In some applications, the substrate may be biased from a further radio frequency supply, this arrangement being referred to as triode etching.

We have found that an excessive proportion of carbon dioxide in the plasma can result in surface roughening and we thus prefer to employ a maximum carbon dioxide concentration of 4% by volume.

Figure 2:
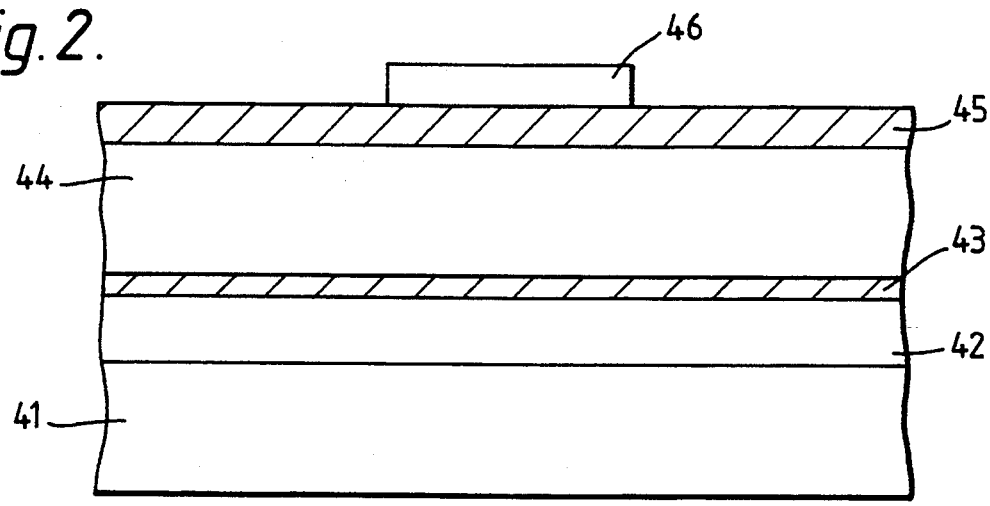
FIGS. 2 to 4 illustrates successive stages in the fabrication of a semiconductor laser.
Figure 3:
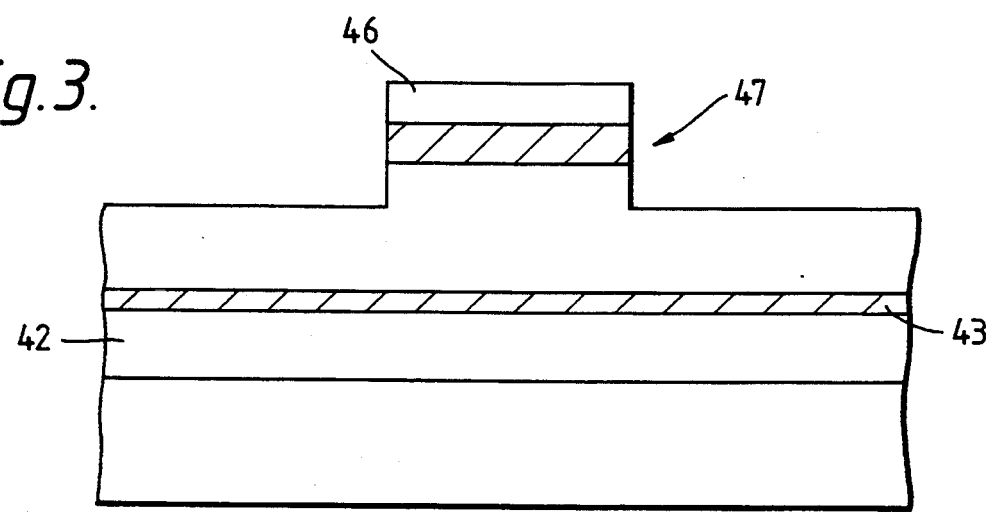
Figure 4:
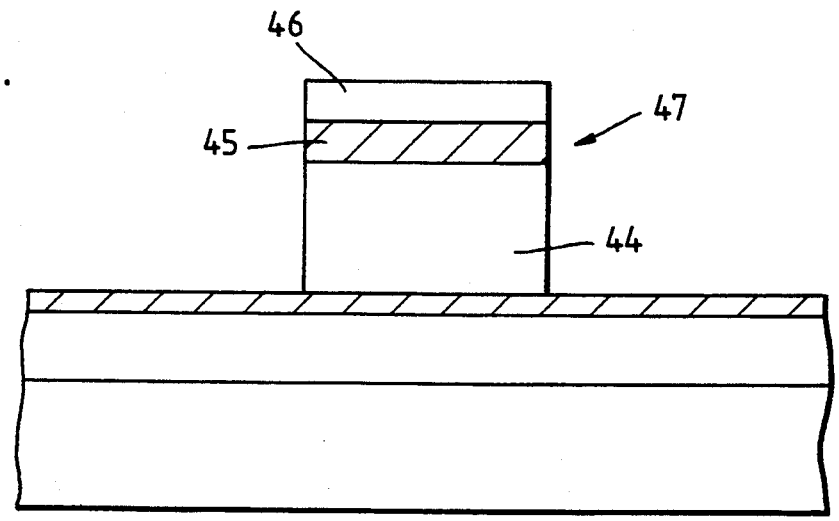

FIGS. 2 to 4 illustrate successive steps in the fabrication of a semiconductor ridge laser using the etching technique described above. Referring to FIG. 2, the semiconductor structure from which the laser is to be formed is supported on a substrate 41, e.g. of indium phosphide, and includes a laser structure 42, an indium gallium arsenide phosphide Q-layer 43, a p-type indium phosphide layer 44 and indium gallium arsenide surface layer 45. The region of the structure that will ultimately form the ridge is defined by an oxide mask 46.

The structure is exposed to a plasma incorporating hydrogen, a hydrocarbon and an oxygen precursor as described above whereby to etch the unmasked regions of the surface whereby to define a ridge structure 47 (FIG. 3). Typically we etch to a depth of about 0.5 micron which corresponds to about one third of the thickness of the p-type indium phosphide layer 44.

The oxide mask 46 is left in place and the partially etched structure is further etched (FIG. 4) by exposure to a mixture of phosphic acid ($H_3PO_4$) and sulphuric acid ($H_2SO_4$). This may comprise a mix of three parts phosphoric acid and one part sulphuric acid. Anisotropic etching proceeds to the full depth of the p-type indium phosphide layer, typically a further 1 micron, to define the ridge 47. In an alternative processing sequence, the wet etching stage may be replaced by 8 continuation of the plasma etching stage to provide a single step process.

Figure 5:
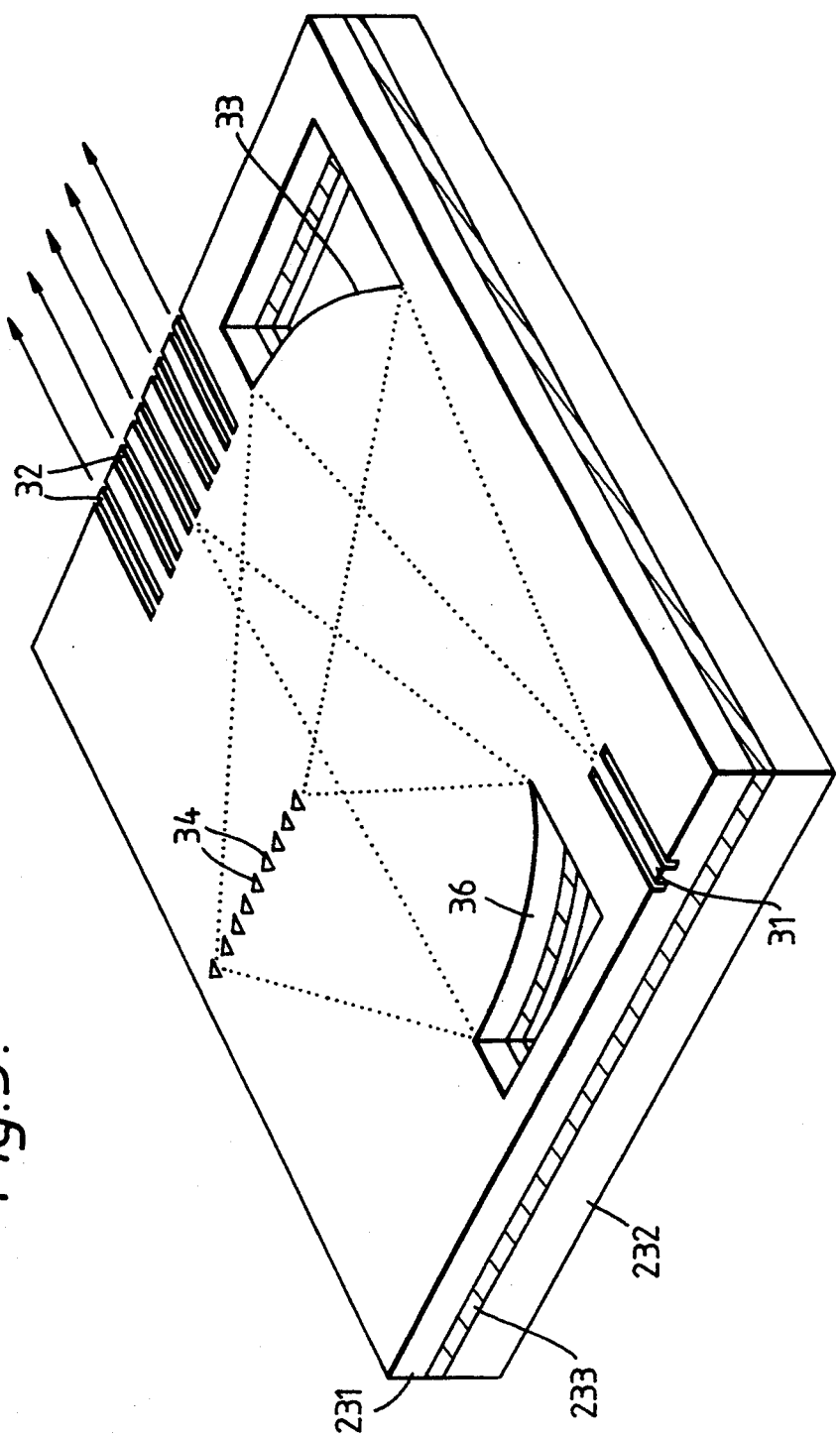
FIG. 5 is a general view of an optical wavelength demultiplexer fabricated via the apparatus of FIG. 1.

An optical wavelength demultiplexer having mirror surfaces formed by the above technique is shown in general view in FIG. 5 of the accompanying drawings. The demultiplexer is formed in a double heterostructure indium gallium arsenide/indium phosphide slab waveguide and includes an input single mode ridge waveguide 31 and a plurality of output single mode ridge waveguides 3a. A diverging light beam from the input waveguide 31 illuminates a first collimating reflective surface 33 whereby the beam is directed to a diffraction grating comprising an array of triangular shaped pits or recesses 34 etched in the semiconductor surface. The construction and operation of an etched diffraction grating is described in our UK specification No. 2,222,891. In order to ensure that the appropriate dispersion is provided by the grating, its period and blaze angle are set to operate in 44th order diffraction.

Wavelength demultiplexed light from the grating is directed on the second mirror surface 36 and hence the corresponding output waveguide 32. Each of the mirror surfaces, 33 and 36 is prepared by the anisotropic etching process described above.

Figure 6:
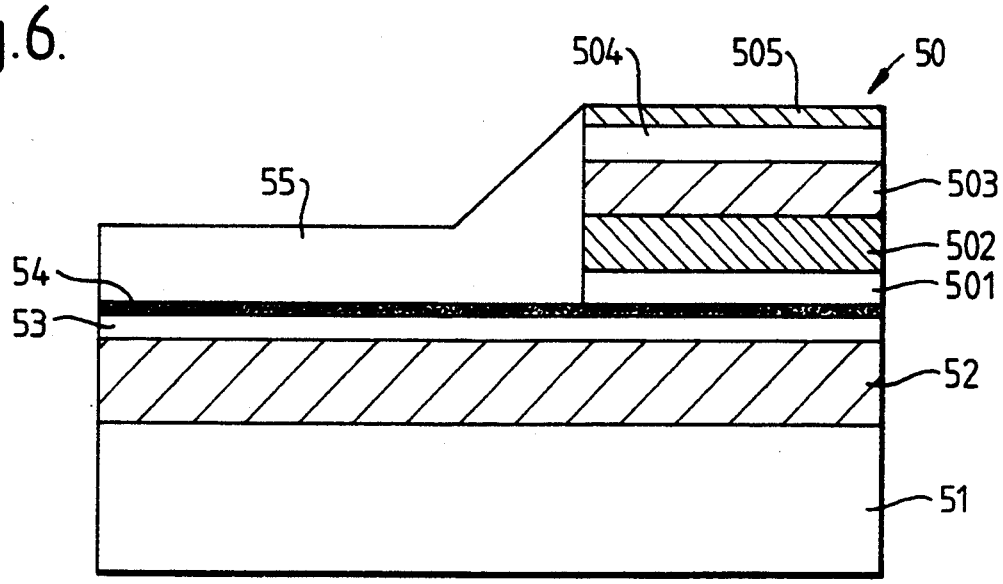
FIG. 6 is a sectional view of an evanescently coupled photo detector structure fabricated with the apparatus of FIG. 1.

Referring now to FIG. 6, there is shown in cross-section an integrated photo detector structure fabricated via the plasma etching technique described above. The detector includes a mesa structure 50 disposed on a slab waveguide comprising an n-type indium phosphide (InP) substrate 51, an n-type InGaAsP waveguide layer 52 and an n-type InP separating layer 53. A further InGaAsP layer 54 may be provided. Light propagating in the waveguide layer 52 is coupled into the detector mesa 50.

The mesa comprises a multilayer PIN diode structure consisting of a lower n-type InP layer 501, an intrinsic InGaAs layer 502, an intrinsic InGaAsP layer 503, an upper p-type InP layer 504 and a p+-type InGaAs capping layer 505. The structure is formed by selectively masking a multilayer structure grown on the substrate 51 via the anisotropic plasma etching process described above to define the mesa. We have found that a suitable gas mixture for this purpose comprises 192 sccm hydrogen, 32 sccm methane and 5 sccm carbon dioxide at a pressure of 60 mtorr. A radio frequency power of 200 watts and a d.c. bias of $-430$ volts were employed. This was found to provide a smooth and planar mesa edge of sufficient quality to permit a masked overgrowth of an InP layer 55. The mesa profile achieved by this plasma etching process was of sufficient quality that the InP overgrowth was smooth and sloped around the detector mesa walls thus leaving a suitable surface for further processing.

Advantageously the detector structure may be integrated with a wavelength demultiplexer.

Figure 7:
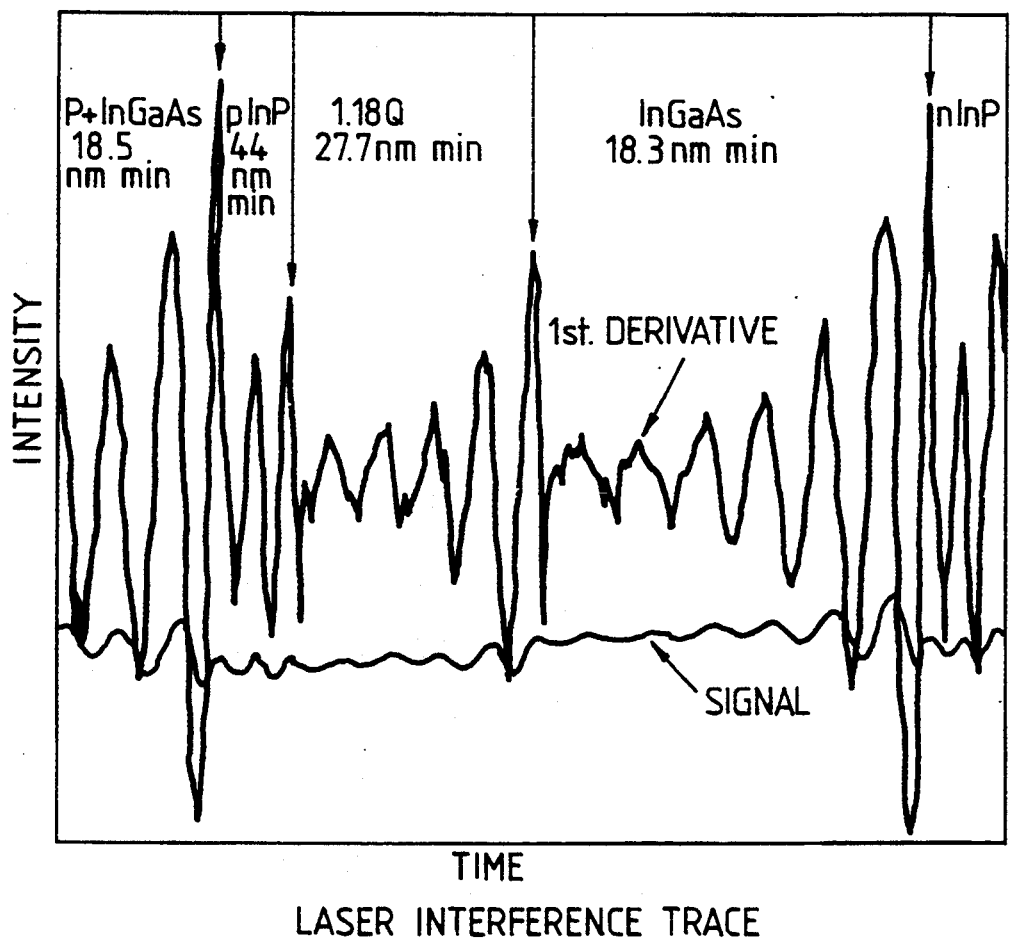
FIG. 7 illustrates interferometric measurements performed during the etching of a multilayer structure via the apparatus of FIG. 1.

It will be appreciated that, when etching the mesa structure, it is necessary to determine the end point of the etching process to prevent etching into the waveguide structure. This may be achieved by a laser interferometric technique in which a laser spot, e.g. at a wavelength of 660 mm, is directed at the desired substrate area whereby to generate an interference pattern whose nature is a function of refractive indium and layer thickness. A typical interference trace is illustrated in FIG. 7 of the drawings. For each layer the first derivative of the light intensity varies generally cyclically, there being a distinct change in the trace at each layer boundary. Thus, by observing the interference trace and counting the cycles, the progress of the anisotropic etching process can be accurately determined.

We claim:

1. A process for the anisotropic dry etching of a compound semiconductor heterostructure, the process including selectively masking a major surface of the heterostructure and exposing the masked heterostructure to a radio-frequency plasma comprising a mixture of methane and hydrogen together with carbon dioxide, nitrous oxide or mixtures thereof whereby to etch anisotropically the unmasked portion of the heterostructure in a direction generally perpendicular to the major surface.

2. A process for the anisotropic dry etching of a compound semiconductor heterostructure, the process including selectively masking a major surface of the heterostructure, and exposing the masked heterostructure to a radio frequency plasma comprising 190 to 195 sccm (standard cubic centimetres per minute) hydrogen, 30 to 35 sccm methane and 5 to 8 sccm carbon dioxide whereby to etch anisotropically the unmasked portion of the heterostructure in a direction generally perpendicular to the major surface.

3. A process as claimed in claim 2, wherein said plasma is generated between a first grounded electrode and a second electrode to which radio-frequency power is applied.

4. A process as claimed in claim 3, wherein a steady (d.c.) electrical bias is maintained between the electrodes, the second electrode being maintained at a negative potential with reference to the first electrode.

5. A process as claimed in claim 4, wherein said plasma is maintained at a pressure of 1 to 200 mtorr.

6. A process as claimed in claim 5, wherein the plasma is maintained at a pressure of 50 to 100 mtorr.

7. A process as claimed in claim 4, wherein the plasma is provided with an energy density of about 1 watt per cubic centimetre.

8. A process for forming a semiconductor ridge laser, the process including providing a compound semiconductor substrate having an indium gallium arsenide phosphide Q-layer, an indium phosphide layer disposed on said Q-layer and an indium gallium arsenide surface layer, applying a mask to a region of said surface layer corresponding to the position of the laser ridge, and exposing the masked structure under reduced pressure to a radio frequency plasma whereby to remove the unmasked regions of said surface layer and define said ridge, wherein the plasma comprises a mixture of methane and hydrogen together with carbon dioxide, nitrous oxide or mixtures thereof.

9. A laser or a wavelength demultiplexer fabricated by a process as claimed in claim 8.

* * * * *